US011700000B2

(12) United States Patent
Roeper

(10) Patent No.: US 11,700,000 B2
(45) Date of Patent: Jul. 11, 2023

(54) CAN BUS TRANSMITTER

(71) Applicant: Microchip Technology Incorporated, Chandler, AZ (US)

(72) Inventor: Wolfgang Roeper, Baden Wuerttemberg (DE)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/573,011

(22) Filed: Jan. 11, 2022

(65) Prior Publication Data

US 2023/0011275 A1     Jan. 12, 2023

Related U.S. Application Data

(60) Provisional application No. 63/219,577, filed on Jul. 8, 2021.

(51) Int. Cl.
| | |
|---|---|
| *H03K 19/003* | (2006.01) |
| *H03K 19/096* | (2006.01) |
| *H03K 19/094* | (2006.01) |
| *G11C 7/10* | (2006.01) |
| *H03K 19/17784* | (2020.01) |
| *H03K 19/17736* | (2020.01) |

(52) U.S. Cl.
CPC ....... *H03K 19/0963* (2013.01); *G11C 7/1039* (2013.01); *H03K 19/00323* (2013.01); *H03K 19/09421* (2013.01); *H03K 19/17744* (2013.01); *H03K 19/17784* (2013.01)

(58) Field of Classification Search
CPC ........... G11C 7/1039; H03K 19/00323; H03K 19/09421; H03K 19/0963; H03K 19/17744; H03K 19/17784
See application file for complete search history.

(56) References Cited

U.S. PATENT DOCUMENTS

| | | | |
|---|---|---|---|
| 5,825,208 A | 10/1998 | Levy et al. | 326/98 |
| 6,324,044 B1 * | 11/2001 | Teggatz | G06F 13/385 |
| | | | 361/119 |
| 10,313,152 B2 * | 6/2019 | Kishigami | H03F 3/24 |
| 2005/0110522 A1 | 5/2005 | Hoekstra | 326/95 |

(Continued)

OTHER PUBLICATIONS

Yee, Gin et al., "Clock-Delayed Domino for Dynamic Circuit Design," IEEE Transactions on Very Large Scale Integration (VLSI) Systems, vol. 8, No. 4, pp. 425-430, Aug. 1, 2000.

(Continued)

*Primary Examiner* — Kurtis R Bahr
(74) *Attorney, Agent, or Firm* — Slayden Grubert Beard PLLC

(57) ABSTRACT

A CAN bus transmitter has an input to receive a transmit data signal, and CANH and CANL outputs coupled to a CAN bus. The CAN bus transmitter comprises a plurality of CAN driver circuits having inputs coupled through delay circuits with their CANH and CANL outputs in common and connected to the CAN bus. Matching of Cgs capacitances between devices of the CANH and CANL legs provides substantially synchronized changes in the CANH and CANL output logic levels upon a change in the input logic level. Variable delaying of the input logic level changes to each of the plurality of CAN driver circuits reduces emission of unwanted signals from the CAN bus.

19 Claims, 4 Drawing Sheets

(56) References Cited

U.S. PATENT DOCUMENTS

| | | | | |
|---|---|---|---|---|
| 2006/0091915 | A1* | 5/2006 | Pauletti | H04L 25/0284 |
| | | | | 327/108 |
| 2016/0094362 | A1* | 3/2016 | Brennan | H04L 12/12 |
| | | | | 327/109 |
| 2016/0269200 | A1* | 9/2016 | Pannwitz | H04L 12/40 |
| 2018/0343161 | A1* | 11/2018 | Gehring | H04L 12/40 |
| 2021/0377060 | A1* | 12/2021 | Muth | G06F 13/4072 |

OTHER PUBLICATIONS

International Search Report and Written Opinion, Application No. PCT/US2022/036105, 16 pages, dated Oct. 20, 2022.
Richards, Pat, "AN228: A CAN Physical Layer Discussion," Microchip Technology Incorporated, URL: https://ww1.microchip.com/downloads/en/Appnotes/00228a.pdf, 12 pages, Jun. 24, 2015.
Sperling, D., "EMC Test Report," IBEE Ingenieurbüro, No. 15-12-20a, 39 pages, Jan. 5, 2021.

\* cited by examiner

CAN BUS TRANSMITTER

RELATED PATENT APPLICATION

This application claims priority to commonly owned U.S. Provisional Patent Application Ser. No. 63/219,577; filed Jul. 8, 2021; entitled "Can Bus Transmitter," which is hereby incorporated by reference herein for all purposes.

TECHNICAL FIELD

The present application relates to controller area network (CAN) physical layer communications and, more particularly, to a CAN bus transmitter with CANH and CANL signal lines having substantially matching rise and fall times.

BACKGROUND

CAN as defined in the International Standards Organization (ISO) 11898 is an international standard specification for high-speed communications in road vehicles. ISO 11898 is a family of specifications in which IS011898-1 covers a datalink layer while ISO 118980-2 and ISO 118980-3 cover physical layers of CAN. CAN is a robust communication protocol. The CAN physical layer is further specified in Microchip Application Note AN 228, (www.microchip.com) incorporated by reference herein for all purposes.

An electronic system may have microprocessor-based modules that communicate over a CAN bus using a message-based protocol, such a microprocessor-based module may be called a CAN module. An important application for CAN modules is in vehicle markets. The CAN modules must be fully compliant with the latest International Electrotechnical Commission (IEC) 6228-3 standard that specifies test and measurement methods for Electromagnetic Compliance (EMC). All CAN modules used in vehicle (automotive) applications must meet the IEC 6228-3 standard for emission of unwanted signals and robustness against external interferers, e.g., direct power injection (DPI) testing which may be used to predict the immunity of an integrated circuit (IC) to withstand electromagnetic interference without exhibiting any malfunction.

The physical layer used for CAN network transmission may be performed by using a differential pair of transmission lines—CANH and CANL. CAN may specify two logical states: recessive and dominant. During the recessive logical state, CANH and CANL may be approximately the same voltage, or within a specified tolerance of voltage from each other. During the dominant logical state, CANH and CANL may be separated by a voltage difference, VDiff.

In the recessive state (e.g., logic '1' on an input of a CAN transceiver (transmitter/receiver) the differential voltage on CANH and CANL is less than the minimum threshold (<0.5V receiver input or <1.5V transmitter output). In the dominant state (e.g., logic '0' on the input of a CAN transceiver, VDiff is greater than the minimum threshold. A dominant bit overdrives a recessive bit on the CAN bus to achieve nondestructive bitwise arbitration.

SUMMARY

Emission requirements in Automotive CAN bus systems are becoming more stringent, especially at higher data rates, e.g., CAN Flexible Data Rate (FD)—5 Megabits per second. Thus, signal matching from the two bus drivers (transmitters) for the CANH and the CANL bus lines may be improved significantly to meet the new emission standards for unwanted signals and robustness against external interferers such as, for example but not limited to, direct power injection (DPI). The terms "bus drivers" and "transmitters" will be used interchangeably hereinafter.

According to an embodiment, a controller area network (CAN) domino driver circuit may comprise: a CAN high (CANH) leg having an input coupled to a transmit data (TXD) signal and a first output for coupling to a CANH circuit of a CAN bus; and a CAN low (CANL) leg having an input coupled to the TXD signal and a second output for coupling to a CANL circuit of the CAN bus; wherein a logic level change of the TXD signal will generate logic level changes at the first and second outputs of the CANH and CANL legs.

According to a further embodiment, the CANH leg may comprise: a P-channel metal oxide semiconductor field effect transistor (PMOSFET); a first resistor; a cascode PMOSFET; a first diode; and an inverting buffer; wherein the PMOSFET source may be coupled to a first voltage level, gate may be coupled to an output of the first buffer, and drain may be coupled to a first node of the first resistor; the cascode PMOSFET source may be coupled to a second node of the first resistor, gate may be coupled to a bias voltage, and drain may be coupled to an anode of the first diode; a cathode of the first diode may be coupled to the first output of the CANH leg; and an input of the first buffer amplifier may be coupled to the input of the CANH leg.

According to a further embodiment, the CANL leg may comprise: an N-channel metal oxide semiconductor field effect transistor (NMOSFET); a second resistor; a cascode NMOSFET; a second diode; and a non-inverting buffer; wherein the NMOSFET source may be coupled to a second voltage level, gate may be coupled to an output of the second buffer amplifier, and drain may be coupled to a first node of the second resistor; the cascode NMOSFET source may be coupled to a second node of the second resistor, gate may be coupled to the bias voltage, and drain may be coupled to a cathode of the second diode; an anode of the second diode may be coupled to the second output of the CANL leg; and an input of the second buffer may be coupled to the input of the CANL leg; a first capacitor may be coupled between the gate and the source of the first NMOSFET; and a second capacitor may be coupled between the gate and the source of the cascode NMOSFET.

According to a further embodiment, wherein the first and second capacitors may bring the capacitances between the gates and the sources of the NMOSFET and cascode NMOFET to substantially the same capacitances as the capacitances between the gates and the sources of the PMOSFET and the cascode PMOSFET, respectively. According to a further embodiment, the first capacitor may be adjustable. According to a further embodiment, the second NMOSFET resistance value Rds-on may be adjustable. According to a further embodiment, the second PMOSFET may be a cascode laterally diffused (LD) MOSFET. According to a further embodiment, the second NMOSFET may be of Ox3 construction. According to a further embodiment, the first PMOSFET may be a laterally diffused (LD) MOSFET. According to a further embodiment, the buffer may be an inverting buffer and the second buffer may be a non-inverting buffer. According to a further embodiment, wherein the buffer may adjustably control rising and falling times of a signal on the CANH leg. According to a further embodiment, the first and second resistors may provide substantially the same signal voltage amplitudes on the first and second outputs of the CANH and CANL legs.

According to another embodiment, a controller area network (CAN) bus driver circuit may comprise: a plurality of CAN domino driver circuits, each one having an input and first and second outputs for respective coupling to CANH and CANL terminals of a CAN bus; a plurality of time delay circuits, each having an input and an output; the input of a first one of the plurality of CAN domino driver circuits and the input of a first one of the plurality of delay circuits coupled to a node, the node for coupling to a transmit data (TXD) signal; and the inputs of each subsequent one of the plurality of delay circuits may be coupled to the output of a previous one of the plurality of time delay circuits, and to the inputs of each subsequent one of the plurality of CAN domino driver circuit may be coupled to the output of the previous one of the plurality of time delay circuits, such that a respective time delay circuit may be between each of the plurality of CAN domino driver circuits after the first one.

According to a further embodiment, the plurality of time delay circuits may have adjustable time delays. According to a further embodiment, time delays of the plurality of adjustable time delay circuits may be statically adjustable. According to a further embodiment, time delays of the plurality of adjustable time delay circuits may be dynamically adjustable. According to a further embodiment, the plurality of time delay circuits may have different time delays. According to a further embodiment, the plurality of time delay circuits may have dithered time delays. According to a further embodiment, each of the time delay circuits may have a time delay from about 3 nanoseconds to about 5 nanoseconds.

According to yet another embodiment, a method for driving a controller area network (CAN) bus may comprise: providing a plurality of CAN domino driver circuits, each having an input and first and second outputs for respective coupling to CANH and CANL terminals of a CAN bus; providing a plurality of time delay circuits, each having an input and an output; coupling the input of a first one of the plurality of CAN domino driver circuits and the input of a first one of the plurality of delay circuits to a node, the node for coupling to a transmit data (TXD) signal; and coupling the inputs of each subsequent one of the plurality of delay circuits to the output of a previous one of the plurality of time delay circuits, and to the inputs of each subsequent one of the plurality of CAN domino driver circuits to the output of the previous one of the plurality of time delay circuits, such that a respective time delay circuit may be between each of the plurality of CAN domino driver circuits after the first one.

According to a further embodiment, the sequentially time delaying TXD signals may comprise statically adjusting time delays of at least some of the time delay circuits. According to a further embodiment, the sequentially time delaying TXD signals may further comprises the step of dynamically adjusting the time delays of at least some of the time delay circuits. According to a further embodiment, the sequentially time delaying TXD signals may further comprises the step of dithering the time delays of at least some of the time delay circuits.

BRIEF DESCRIPTION OF THE DRAWINGS

A more complete understanding of the present disclosure may be acquired by referring to the following description taken in conjunction with the accompanying drawings wherein.

Figure 1:
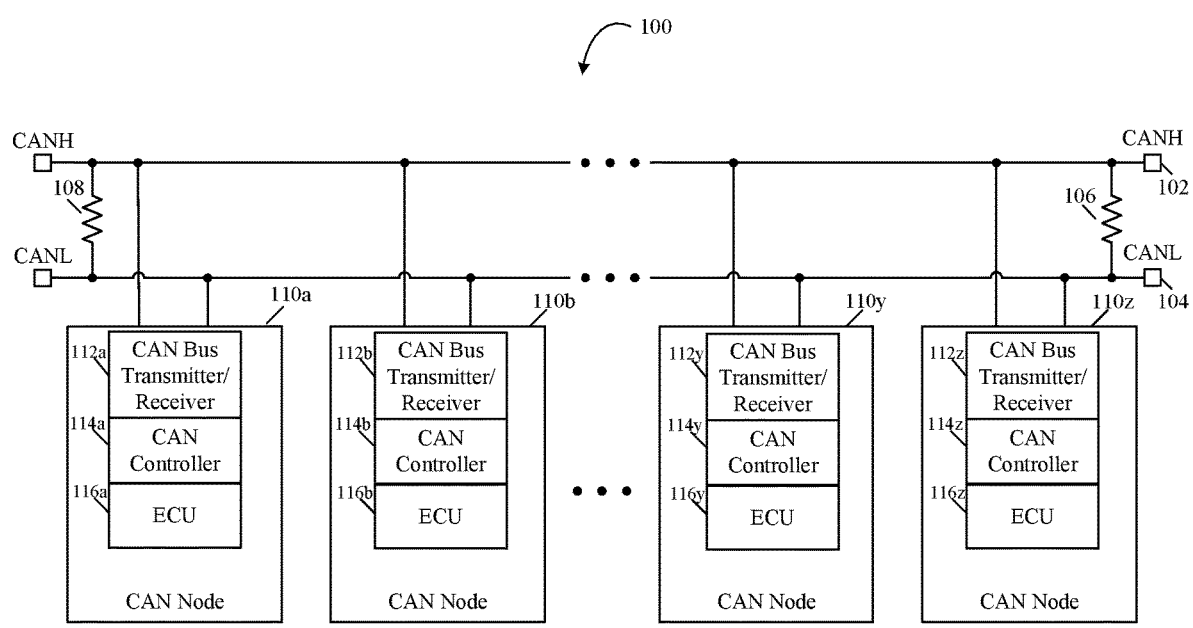
FIG. 1 is an illustration of an electronic system using a CAN bus for communications between electronic control units (ECUs)

While the present disclosure is susceptible to various modifications and alternative forms, specific examples thereof have been shown in the drawings and are herein described in detail. It should be understood, however, that the description herein of specific examples is not intended to limit the disclosure to the forms disclosed herein.

DETAILED DESCRIPTION

When differential signals on a transmission line are of equal amplitudes and 180 degrees out of phase the common mode voltage therebetween will be substantially reduced. When the amplitudes are not the same and/or the difference in phase is not 180 degrees, vector subtraction of the two signals will not completely cancel each other out and can produce spurious emissions (signals) therefrom.

An output driver circuit for the physical layer of a CAN bus system, which is fully compliant with the latest IEC6228-3 specification, may be used for classical CAN and CAN FD networks in automotive (vehicle), aerospace, medical, industrial and consumer applications. The output driver circuit may use switched resistors for generating the output amplitude of the CAN bus signals. Pulse shaping may be performed by the use of adjustable delay steps between a plurality of driver circuits ("dominos") configured into a cascading domino effect CAN bus driver circuit. Trimming of laterally diffused N-channel metal oxide semiconductor (LDNMOS) and laterally diffused P-channel metal oxide semiconductor (LDPMOS) transistors for a reduction of mismatch therebetween is disclosed herein. Matching between the CANH and CANL driver outputs provides improved emission performance. The use of switched resistors in the output stage significantly improves this matching and provides the desired low emission results.

Referring now to the drawings, the details of examples are schematically illustrated. Like elements in the drawings will be represented by like numbers, and similar elements will be represented by like numbers with a different lower-case letter suffix.

Referring to FIG. 1, depicted is an electronic system using a CAN bus for communications between electronic control units (ECUs). An electronic system, generally represented by the numeral 100, may comprise a plurality of CAN nodes 110, denoted as 110a, 110b . . . 110y, 110z, communicating over a CAN bus consisting of a CANH signal line 102 and a CANL signal line 104. Termination resistor 106 may be coupled at one end of the CAN bus and termination resistor 108 may be coupled at the other one end of the CAN bus (CANH 102, CANL 104). A CAN node 110 may comprise a CAN bus transmitter/receiver (transceiver) 112, a CAN controller 114, and an electronic control unit (ECU) 116. Each ECU 116 may control a different subsystem of the electronic system 100. Examples of the different subsystems for a vehicle may include any of: engine control unit, driver assistance, automatic transmission control, airbags, antilock braking/ABS, cruise control, electric power steering, audio systems, power windows, doors, mirror adjustment, battery and recharging systems to name a few.

Figure 2:
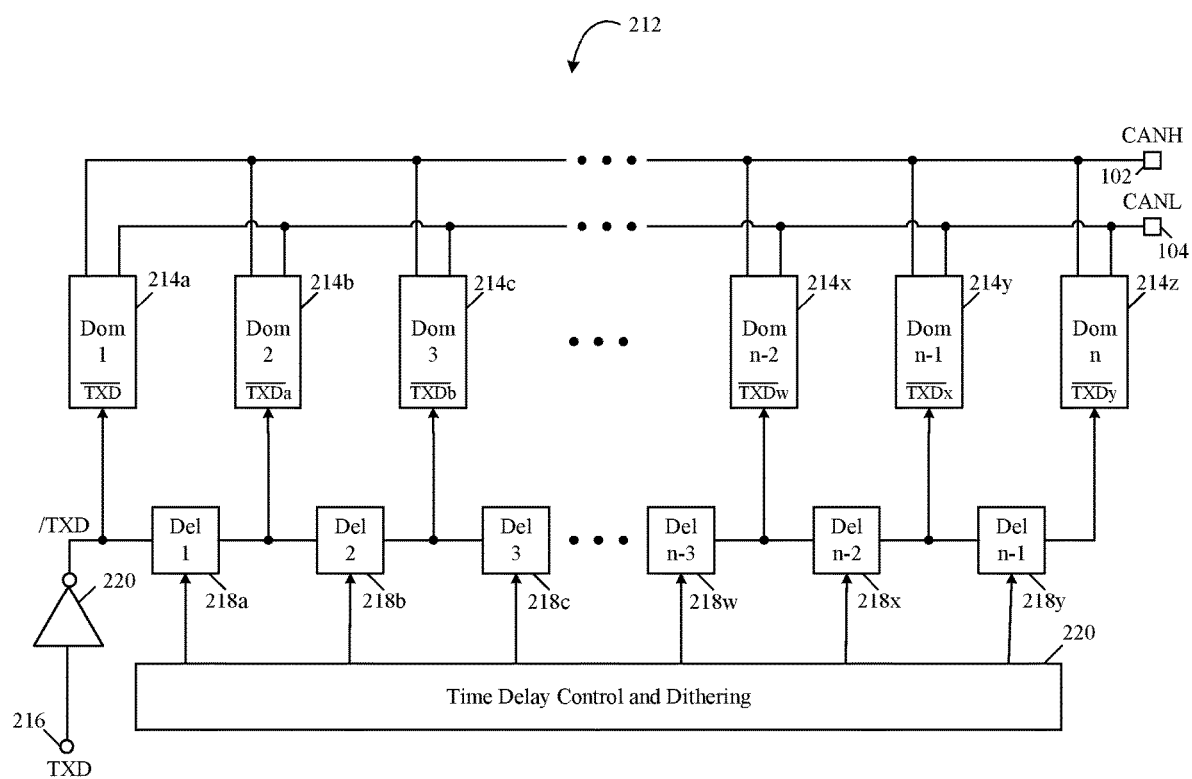
FIG. 2 is an illustration of an example CAN bus driver circuit comprising a plurality of domino driver circuits separated by associated delay circuits, according to examples of the present disclosure.

Referring to FIG. 2, depicted is an example CAN bus driver circuit comprising a plurality of domino driver circuits separated by associated delay circuits, according to examples of the present disclosure. A CAN driver circuit, generally represented by the numeral 212, may comprise a plurality of domino driver circuits 214 that may cause substantially symmetrical CANH and CANL signals on the CANH 102 and CANL 104 terminals. The CAN driver circuit 212 is the transmitter portion of the CAN bus transmitter/receiver 112. "Domino driver circuits" are defined herein as a series of driver circuits arranged for use in a cascade, each being sequentially driven through a time delay by a preceding domino driver circuit in a chain reaction like cascading domino chips.

Each domino driver circuit 214 may individually drive the CAN bus, and may be configured to generate CANH and CANL output signals on the CANH 102 and CANL 104 terminals shown in FIGS. 1 and 2 based upon the logic value received at the transmit data (TXD) input 216. A first domino driver circuit 214a may be coupled to the TXD input 216 through an inverter 220 which inverts the TXD signal thereto. Subsequent domino driver circuits 214 are coupled through respective time delay circuits 218 to the output of inverter 220. The time delay circuits 218 provide cumulative time delays of the inverted TXD input to each subsequent domino driver circuit 214 of CAN driver circuit 212, such that the delay between the inverted TXD signal and each subsequent domino driver circuit 214 is increased by the respective time delay circuit 218. There may be any suitable number and kind of domino driver circuits 214 and time delay circuits 218. For example, but without limitation, there may be twenty (20) domino driver circuits 214, separated by nineteen (19) time delay circuits 218. The domino driver circuits 214 and time delay circuits 218 may be implemented in any suitable manner, such as by analog circuitry, digital circuitry, instructions for execution by a digital processor (not shown), or any suitable combination thereof.

The time delay provided by each of the delay circuits 218 may vary from delay circuit 218a to delay circuit 218y. The delay time is longer than the switching time of the transistor driver circuit 214. The time delays may be in the range of, for example, from about three (3) nanoseconds to about five (5) nanoseconds. The time delays may vary according to, for example, a sinusoidal function, a ramp function, or any other suitable function. The time delay provided by each of the delay circuits 218 may start high, lessen, then rise again, in a given period. The time delays may vary from iteration to iteration of execution, or may delay from one another within a given iteration. If all the time delays were equal, such as two (2) nanoseconds, frequency spikes may occur, which may be observed on the CAN bus. The time delays may be changed (adapted) so that the spikes are not at the same frequency. A time delay control and dithering circuit 220 may be used to set different time delays statically or dynamically for each of the plurality of time delay circuits 218.

Figure 3:
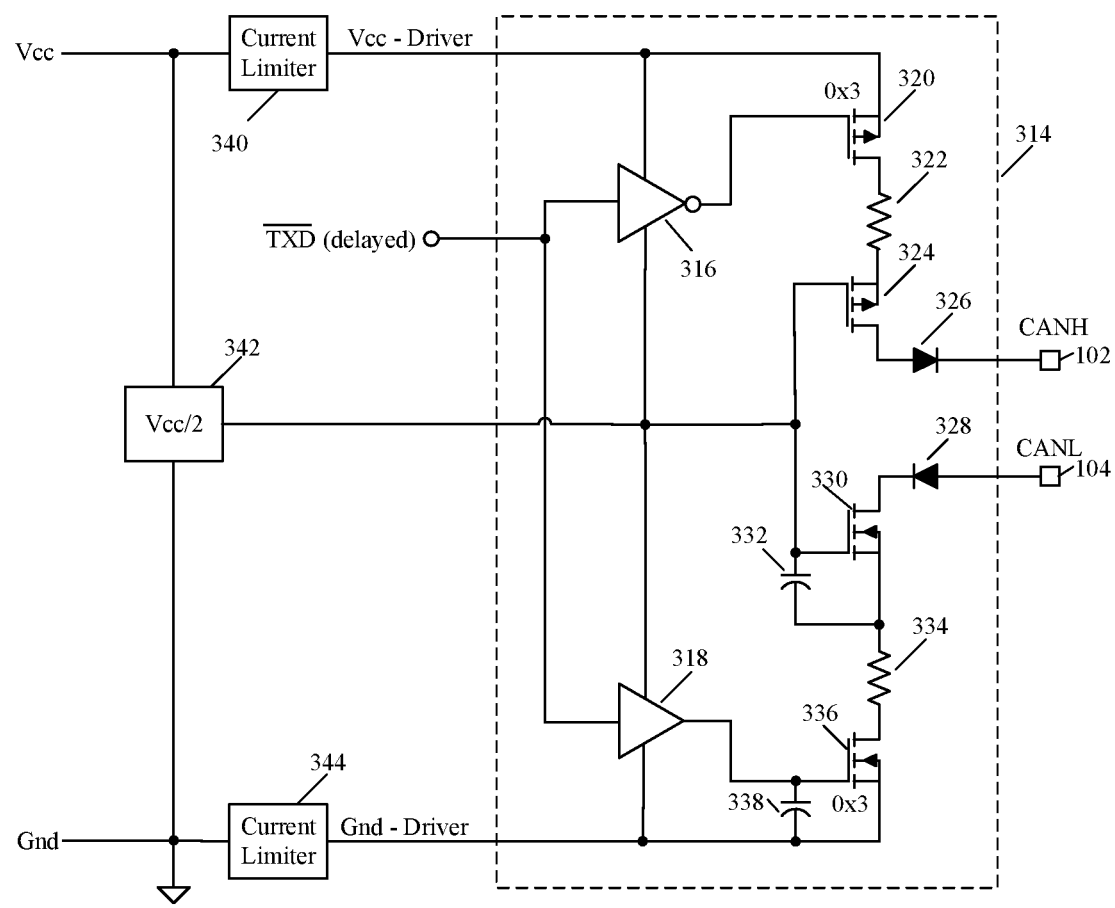
FIG. 3 is an illustration of an example domino driver circuit for the CAN bus driver circuit of FIG. 2, according to examples of the present disclosure.

Referring to FIG. 3, depicted is an example domino driver circuit 314 for the CAN bus driver circuit of FIG. 2, according to examples of the present disclosure. Domino driver circuit 314 may be used for any of domino driver circuits 214 of FIG. 2. Domino driver circuit 314 may comprise an inverting buffer 316, a non-inverting buffer 318, a P-channel metal oxide semiconductor field effect transistor (PMOSFET) 320, a first impedance 322, a cascode PMOS-FET 324, a first diode 326, a second diode 328, a cascode N-channel MOSFET (NMOSFET) 330, a first capacitor 332, a second impedance 334, an NMOSFET 336, and a second capacitor 338. Power (Vcc) may be coupled to the domino driver circuit 314 through a first current limiter 340. A half-voltage bias (Vcc/2) may be coupled to the domino driver circuit 314 through a voltage divider 342. A second voltage level (ground) or power return may be coupled to the domino driver circuit 314 through a second current limiter 344. The current limiters 340 and 344, and voltage divider 342 may be common to all of the domino driver circuits 314 comprising the CAN driver circuit 212. PMOSFET 320 and NMOSFET 336 may be of Ox3 construction, where Ox3 construction means: a thermally grown gate thin $SiO_2$ oxide in $N_2O$ ambient+Tetraethyl orthosilicate (TEOS), chemical formula $Si(OC_2H_5)_4$, deposition of 400 Å with an oxidation process. Cascode PMOSFET 324 and NMOSFET 330 may be MOSFETs or laterally diffused (LD) MOSFETs.

Inputs of the inverting buffer 316 and the non-inverting buffer 318 are coupled to an inverted transmit data (/TXD) signal. A non-delayed/TXD signal is coupled to the input of the first domino driver circuit 214a, and subsequent/TXD signals are delayed by each respective time delay circuit 218 and then coupled to respective ones of the domino driver circuits 214, such that the delay of the/TXD signal for each subsequent domino driver circuit 214 is increased in relation to the previous domino driver circuit by the respective time delay circuit 218. The inverting buffer 316 and the non-inverting buffer 318 may be coupled between Vcc and Vcc/2, and between Vcc/2 and common (Gnd), respectively, to obtain operating voltages therefrom. The CANH 102 bus operates from about 2.5 to 5 volts, and the CANL 104 bus operates from about 0 to 2.5 volts.

The TXD signal may be inverted, e.g., to form the/TXD signal as it is received for proper operation of the circuit shown in FIG. 3. The/TXD signal may be coupled through the inverting buffer 316 to the gate of PMOSFET 320 which PMOSFET 320 may be selected for use as a high-speed switch for the CANH signal. The/TXD signal may be coupled through the non-verting buffer 318 to the gate of the NMOSFET 336 which NMOSFET 336 may be selected for use as a high-speed switch for the CANL signal.

A CANH leg may comprise the PMOSFET 320, first impedance 322, cascode PMOSFET 324, and first diode 326 coupled to the CANH terminal 102. The CANH leg may be coupled between Vcc and the CANH terminal 102. The first current limiter 340 may be coupled between Vcc, the inverting buffer 316 and the source of the PMOSFET 320 of the CANH leg.

The CANH leg may include an Ox3 or 3-volt PMOS transistor or other suitable solid-state switch for the PMOS-FET 320. This solid-state switch for the PMOSFET 320 may switch with less of a delay than the delay of the respective delay circuit 218, i.e., it may be faster than the delay of the respective delay circuits 218, and may be driven by the output of the buffer 316. The first impedance 322 of the CANH leg may comprise a resistor, package of resistors, or other suitable impedance. The first impedance 322 may be switched in and out of the circuit, according to the operation of the PMOSFET 320. The first impedance 322 may be connected between the drain of the Ox3 PMOSFET 320 and the source of the cascode PMOSFET 324. The first diode 326 may be coupled between the drain of the cascode PMOSFET 324 and the CANH terminal 102. The gate of the cascode PMOSFET 324 may be biased by the VCC/2 output from the voltage divider 342.

A CANL leg may comprise the NMOSFET 336, second impedance 334, cascode NMOSFET 330, and second diode 328 coupled to the CANL terminal 104. The CANL leg may be coupled between the CANL terminal 104 and second voltage level (ground). The second current limiter 344 may be coupled between ground, the non-inverting buffer 318 and the source of the NMOSFET 336 of the CANL leg.

The CANL leg may include an O×3 or 3-volt NMOS transistor or other suitable solid-state switch for the NMOSFET 336. This solid-state switch for the NMOSFET 336 may switch with less of a delay than the delay of the respective delay circuit 218, i.e., it may be faster than the delay of the respective delay circuits 218, and may be driven by the output of the buffer 318. The second impedance 334 of the CANL leg may comprise a resistor, package of resistors, or other suitable impedance. The second impedance 334 may be switched, according to the operation of the NMOSFET 336. The second impedance 334 may be connected between the drain of the NMOSFET 336 and the source of the cascode NMOSFET 330. The second diode 328 may be coupled between the drain of the cascode NMOSFET 330 and the CANL terminal 104. The gate of the cascode NMOSFET 320 may be biased by the VCC/2 output from the voltage divider 342.

The physical structure of a PMOSFET is larger than an NMOSFET, therefore the PMOSFET has a larger Cgs value than the NMOSFET. Capacitors 332 and 338 may be added between the sources and gates of the cascode NMOSFET 330 and NMOSFET 336, respectively, to provide total input capacitances (Cgs) that closely match the Cgs of the PMOSFET 324 and PMOSFET 320, respectively. These added capacitances enable better matching of the switching times of NMOSFET 330 and NMOSFET 336 with the switching times of the PMOSFET 324 and PMOSFET 320, respectively, thus enabling better slope and edge delay matching of the CANH and CANL driver outputs so as to achieve good emission performance. In addition, use of resistors, e.g., first and second impedances 322 and 334, in the driver outputs (CANH and CANL legs) may significantly improve signal amplitude matching between the CANH and CANL signal waveforms. Substantially matching the slope and edge delays, and amplitudes of the CANH and CANL signals may provide better emission performance (reduced emissions) of the CAN node 110. Values for the capacitors 332 and 338 may be selected during the integrated circuit design to provide a total Cgs of the NMOSFETs 330 and 336 that closely match the total Cgs of the PMOSFETs 324 and 320, respectively. Values for the resistors 322 and 334 may be determined during the integrated circuit design and may be different for each of the domino driver circuits 214 of the CAN driver circuit 212.

In one example, the larger capacitive value Cgs of the cascode PMOSFET 324 may be compensated for in the CANL leg. The structure of the cascode NMOSFET 330 may be significantly smaller than the structure of the PMOSFET 324, and therefore its Cgs will have a smaller capacitance than the Cgs of the PMOSFET 324. As a result, the time required to activate the PMOSFET 324 may be greater than the time required to activate the NMOSFET 330. This may cause the PMOSFET 324 to operate more slowly than the NMOSFET 330, resulting in poorer synchronization of the CANH and CANL output signals on the CANH and CANL terminals 102 and 104. Accordingly, the capacitor 332 may be added between the gate and source of the NMOSFET 330 so that the total capacitance thereof may substantially match the Cgs capacitance of the PMOSFET 324. The capacitance of the first capacitor 332, and thus the total Cgs of the NMOSFET 330, may be determined at the time of integrated circuit design. Similarly, the capacitor 338 may be added between the gate and source of the NMOSFET 336 to make its total Cgs substantially the same as the Cgs of the PMOSFET 320.

Figure 4:
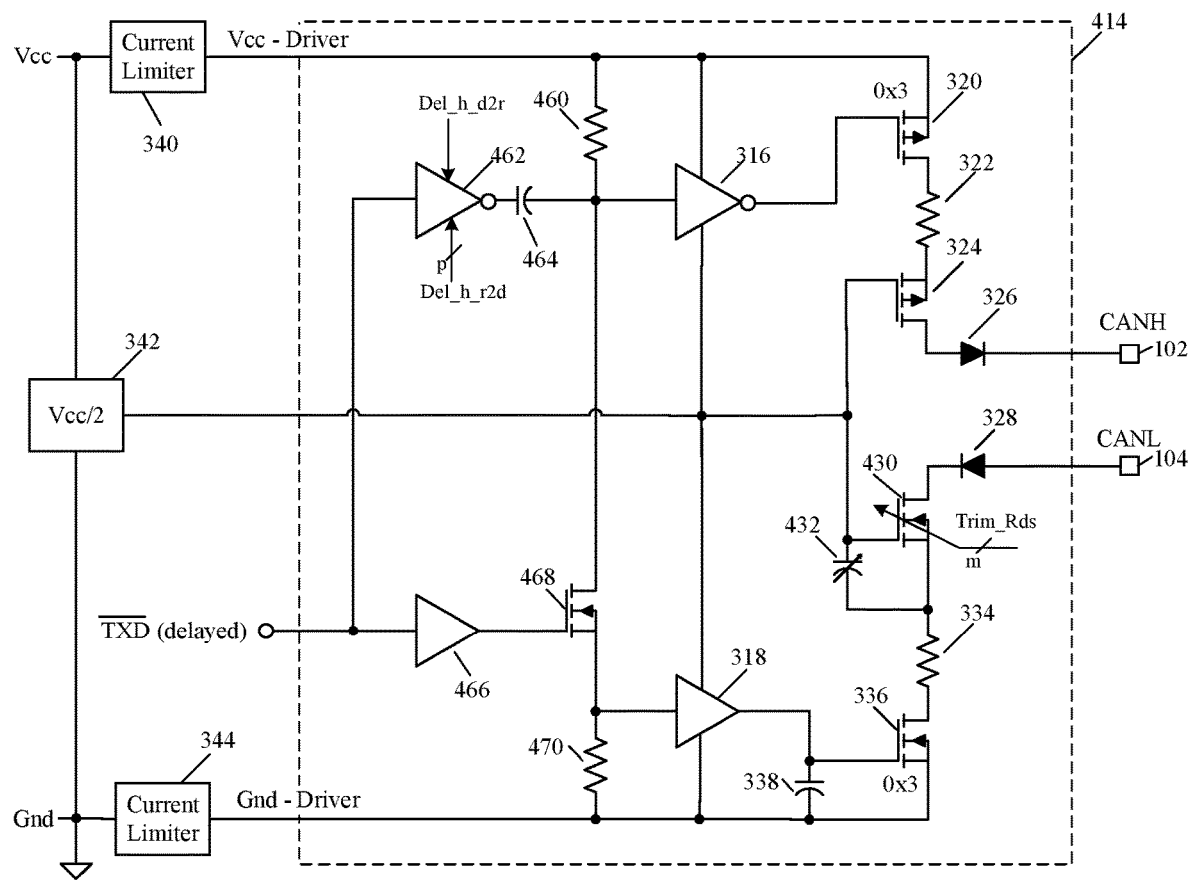
FIG. 4 is an illustration of another example domino driver circuit for the CAN bus driver circuit of FIG. 2, according to examples of the present disclosure.

Referring to FIG. 4, depicted is another example domino driver circuit 414 for the CAN bus driver circuit of FIG. 2, according to examples of the present disclosure. Domino driver circuit 414 may be used for any of domino driver circuits 214 of FIG. 2. The domino driver circuit 414 has CANH and CANL legs that operate in substantially the same way as the ones in the domino driver circuit 314 of FIG. 3 and described hereinabove.

In one example, the larger capacitive value Cgs of the cascode PMOSFET 324 may be compensated for in the CANL leg. The structure of the cascode NMOSFET 430 may be significantly smaller than the structure of the PMOSFET 324, and therefore its Cgs will have a smaller capacitance than the Cgs of the PMOSFET 324. As a result, the time required to activate the PMOSFET 324 may be greater than the time required to activate the NMOSFET 430. This may cause the PMOSFET 324 to operate more slowly than the NMOSFET 430, resulting in poorer synchronization of the CANH and CANL output signals on the CANH bus line 102 and CANL bus line 104, respectively. Accordingly, a fixed or variable capacitor 432 may be added between the gate and source of the NMOSFET 430 so that the total capacitance thereof may substantially match the Cgs capacitance of the PMOSFET 324. The capacitance of the capacitor 432, and thus the total Cgs of the NMOSFET 430, may be determined at the time of integrated circuit design. Similarly, the capacitor 338 may be added between the gate and source of the NMOSFET 336 to make its total Cgs substantially the same as the Cgs of the PMOSFET 320. Furthermore, the cascode NMOSFET 430 may have its resistance value Rds-on adjusted during design to match the Rds-on of the cascode PMOSFET 324. This may be implemented by enabling/disabling small transistors coupled to the cascode NMOSFET 430.

Inverting buffer 462 may be configured to provide rise and fall time adjustments of the CAN bus signals with adjustments of Del_h_d2r and Del_h_r2d. Capacitor 464, resistors 460 and 470, and NMOSFET 468 provide voltage level shifting between the respective outputs of inverting buffer 462 and buffer 466 and the inputs of inverting buffer 316 and non-inverting buffer 466. The CANH bus line 102 voltage range is about 2.5 to 5 volts, and the CANL bus line 104 voltage range is about 0 to 2.5 volts, with Vcc begin about 5 volts. The rise and fall time adjustments may be incorporated in the inverting buffer amplifier 462 responsive to signals Del_h_d2r and Del_h_r2d, if voltage level functions are not required and for circuit operation purposes inverting buffer amplifier 316 or non-inverting buffer amplifier 318 may be considered as one buffer amplifier providing adjustable rise and fall times of a signal on the CANH bus line 102 or CANL bus line 104, respectively.

The present disclosure has been described in terms of one or more examples, and it should be appreciated that many equivalents, alternatives, variations, and modifications, aside from those expressly stated, are possible and within the scope of the disclosure. While the present disclosure is susceptible to various modifications and alternative forms, specific examples thereof have been shown in the drawings and are herein described in detail. It should be understood, however, that the description herein of specific examples is not intended to limit the disclosure to the particular forms disclosed herein.

What is claimed is:

1. A controller area network (CAN) domino driver circuit, comprising:
   a CAN high (CANH) leg having an input coupled to a transmit data (TXD) signal and a first output for coupling to a CANH circuit of a CAN bus; and
   a CAN low (CANL) leg having an input coupled to the TXD signal and a second output for coupling to a CANL circuit of the CAN bus;
   wherein a logic level change of the TXD signal will generate logic level changes at the first and second outputs of the CANH and CANL legs;
   wherein the CANH leg comprises:
   a P-channel metal oxide semiconductor field effect transistor (PMOSFET);
   a first resistor;
   a cascode PMOSFET;
   a first diode; and
   an inverting buffer;
   wherein
      the PMOSFET source is coupled to a first voltage level, the PMOSFET gate is coupled to an output of the first buffer, and the PMOSFET drain is coupled to a first node of the first resistor;
      the cascode PMOSFET source is coupled to a second node of the first resistor, the cascode PMOSFET gate is coupled to a bias voltage, and the cascade PMOSFET drain is coupled to an anode of the first diode;
      a cathode of the first diode is coupled to the first output of the CANH leg; and
      an input of the first buffer amplifier is coupled to the input of the CANH leg.

2. The CAN domino driver circuit according to claim 1, wherein the CANL leg comprises:
   an N-channel metal oxide semiconductor field effect transistor (NMOSFET);
   a second resistor;
   a cascode NMOSFET;
   a second diode; and
   a non-inverting buffer;
   wherein
      the NMOSFET
         source is coupled to a second voltage level,
         gate is coupled to an output of the second buffer amplifier, and
         drain is coupled to a first node of the second resistor;
      the cascode NMOSFET
         source is coupled to a second node of the second resistor,
         gate is coupled to the bias voltage, and
         drain is coupled to a cathode of the second diode;
      an anode of the second diode is coupled to the second output of the CANL leg; and
      an input of the second buffer is coupled to the input of the CANL leg;
      a first capacitor coupled between the gate and the source of the first NMOSFET; and
      a second capacitor coupled between the gate and the source of the cascode NMOSFET.

3. The CAN domino driver circuit according to claim 2, wherein the first and second capacitors bring the capacitances between the gates and the sources of the NMOSFET and cascode NMOFET to substantially the same capacitances as the capacitances between the gates and the sources of the PMOSFET and the cascade PMOSFET, respectively.

4. The CAN domino driver circuit according to claim 2, wherein the first capacitor is adjustable.

5. The CAN domino driver circuit according to claim 2, wherein the second NMOSFET resistance value Rds-on is adjustable.

6. The CAN domino driver circuit according to claim 2, wherein the second NMOSFET is of O×3 construction.

7. The CAN domino driver circuit according to claim 2, wherein the first PMOSFET is a laterally diffused (LD) MOSFET.

8. The CAN domino driver circuit according to claim 2, wherein the buffer is an inverting buffer and the second buffer is a non-inverting buffer.

9. The CAN domino driver circuit according to claim 2, wherein the first and second resistors provide substantially the same signal voltage amplitudes on the first and second outputs of the CANH and CANL legs.

10. The CAN domino driver circuit according to claim 1, wherein the second PMOSFET is a cascode laterally diffused (LD) MOSFET.

11. The CAN domino driver circuit according to claim 1, wherein the buffer adjustably controls rising and falling times of a signal on the CANH leg.

12. A controller area network (CAN) bus driver circuit, comprising:
   a plurality of CAN domino driver circuits, respective CAN domino driver circuits having an input and first and second outputs for respective coupling to CANH and CANL terminals of a CAN bus;
   a plurality of time delay circuits, respective time delay circuits having an input and an output;
   the input of a first one of the plurality of CAN domino driver circuits and the input of a first one of the plurality of delay circuits coupled to a node, the node for coupling to a transmit data (TXD) signal; and
   the inputs of respective subsequent one of the plurality of delay circuits are coupled to the output of a previous one of the plurality of time delay circuits, and to the inputs of each subsequent one of the plurality of CAN domino driver circuit are coupled to the output of the previous one of the plurality of time delay circuits, such that a respective time delay circuit is between respective ones of the plurality of CAN domino driver circuits after the first one,
   wherein the plurality of time delay circuits have adjustable time delays.

13. The CAN bus driver circuit according to claim 12, wherein time delays of the plurality of adjustable time delay circuits are statically adjustable.

14. The CAN bus driver circuit according to claim 12, wherein time delays of the plurality of adjustable time delay circuits are dynamically adjustable.

15. The CAN bus driver circuit according to claim 12, wherein the plurality of time delay circuits have different time delays.

16. The CAN bus driver circuit according to claim 12, wherein the plurality of time delay circuits have dithered time delays.

17. The CAN bus driver circuit according to claim 12, wherein each of the time delay circuits has a time delay from about 3 nanoseconds to about 5 nanoseconds.

18. A method for driving a controller area network (CAN) bus, said method comprising:
   providing a plurality of CAN domino driver circuits, respective CAN domino driver circuits having an input and first and second outputs for respective coupling to CANH and CANL terminals of a CAN bus;
   providing a plurality of time delay circuits, respective time delay circuits having an input and an output;

coupling the input of a first one of the plurality of CAN domino driver circuits and the input of a first one of the plurality of delay circuits to a node, the node for coupling to a transmit data (TXD) signal;

dynamically adjusting time delays of at least some of the plurality of time delay circuits; and coupling the inputs of respective subsequent ones of the plurality of delay circuits to the output of a previous one of the plurality of time delay circuits, and to the inputs of respective subsequent ones of the plurality of CAN domino driver circuits to the output of the previous one of the plurality of time delay circuits, such that a respective time delay circuit is between respective ones the plurality of CAN domino driver circuits after the first one.

19. The method according to claim 18, wherein the step of dynamically adjusting time delays comprises the step of dithering the time delays of at least some of the time delay circuits.

\* \* \* \* \*